(12) United States Patent
Hertel et al.

(10) Patent No.: US 8,242,375 B2
(45) Date of Patent: Aug. 14, 2012

(54) CONDUCTIVE EMISSIONS PROTECTION

(75) Inventors: Thomas A. Hertel, Santa Clarita, CA (US); Erich H. Soendker, Granada Hills, CA (US); Horacio Saldivar, Canoga Park, CA (US)

(73) Assignee: United Technologies Corporation, Hartford, CT (US)

( * ) Notice: Subject to any disclaimer, the term of this patent is extended or adjusted under 35 U.S.C. 154(b) by 820 days.

(21) Appl. No.: 12/212,975

(22) Filed: Sep. 18, 2008

(65) Prior Publication Data

US 2010/0065308 A1 Mar. 18, 2010

(51) Int. Cl.
*H05K 1/03* (2006.01)
(52) U.S. Cl. ....................................... 174/255
(58) Field of Classification Search .................. 174/255; 29/832
See application file for complete search history.

(56) References Cited

U.S. PATENT DOCUMENTS

| | | | |
|---|---|---|---|
| 4,323,756 A | 4/1982 | Brown et al. | |
| 4,523,528 A * | 6/1985 | Hastings et al. | 109/42 |
| 4,607,316 A * | 8/1986 | Wada et al. | 361/321.4 |
| 4,814,232 A | 3/1989 | Bluege et al. | |
| 5,052,102 A | 10/1991 | Fong et al. | |
| 5,106,461 A * | 4/1992 | Volfson et al. | 205/125 |
| 5,306,560 A | 4/1994 | Wright et al. | |
| 5,386,798 A | 2/1995 | Lowndes et al. | |
| 5,449,536 A | 9/1995 | Funkhouser et al. | |
| 5,607,899 A | 3/1997 | Yoshida et al. | |
| 5,663,081 A | 9/1997 | Sung et al. | |
| 5,906,310 A | 5/1999 | Vinciarelli | |
| 6,045,671 A * | 4/2000 | Wu et al. | 506/40 |
| 6,156,654 A | 12/2000 | Ho et al. | |
| 6,353,189 B1 * | 3/2002 | Shimada et al. | 174/255 |
| 6,452,781 B1 * | 9/2002 | Ahiko et al. | 361/321.2 |
| 6,524,643 B1 | 2/2003 | Nakamura et al. | |
| 6,873,513 B2 * | 3/2005 | Anthony | 361/118 |
| 7,209,368 B2 * | 4/2007 | Lauffer et al. | 361/816 |
| 7,411,278 B2 * | 8/2008 | Wen et al. | 257/659 |
| 2004/0109298 A1 * | 6/2004 | Hartman et al. | 361/762 |
| 2007/0096293 A1 * | 5/2007 | Wen et al. | 257/704 |
| 2007/0181993 A1 * | 8/2007 | Choi et al. | 257/698 |
| 2009/0017309 A1 * | 1/2009 | Lee et al. | 428/418 |
| 2009/0079041 A1 * | 3/2009 | Huang et al. | 257/660 |

FOREIGN PATENT DOCUMENTS

EP 0914032 5/1999

OTHER PUBLICATIONS

International Search Report dated Dec. 1, 2009.
Singh J et al: "Review Nano and macro-structured component fabrication by electron beam-physical vapor deposition (EB-PVD)" Journal of Materials Science, Kluwer Academic Publishers, BO, vol. 40, No. 1, Jan. 1, 2005, pp. 1-26.
Horwitz J S et al: "Pulse laser deposition of electronic ceramics" Surface and Coatings Technology, Elsevier, Amsterdam, NL, vol. 51, No. 1-3, Apr. 15, 1992, pp. 290-298.
International Preliminary Report on Patentability dated Mar. 31, 2011.

* cited by examiner

*Primary Examiner* — Timothy Thompson
*Assistant Examiner* — Nathan Milakovich
(74) *Attorney, Agent, or Firm* — Carlson, Gaskey & Olds

(57) ABSTRACT

According to one non-limiting embodiment, a low conductive emission substrate includes a plurality of thin high dielectric strength insulating layers separated by a corresponding plurality of conductive layers, wherein one of the plurality of conductive layers is shorted to another one of the plurality of conductive layers.

16 Claims, 1 Drawing Sheet

CONDUCTIVE EMISSIONS PROTECTION

BACKGROUND

This application relates to a multi-layer substrate for an electronic device, and more particularly to forming a low conductive emission substrate for an electronic device.

Electronic components, such as switches, can be formed on a die which can then be received on a substrate for inclusion in a larger electronic circuit. For example, FIG. 1 schematically illustrates a first prior art multi-layer substrate 10 for an electrical component 12, such as a die. The substrate includes a single conductive layer 14 and a single insulating layer 16 (or "dielectric layer") formed on a ground structure 18. The conductive layer 14 is formed on the insulating layer 16, and receives the electrical component 12. An effective parasitic capacitance 20 occurs between the conductive layer 14 and the ground structure 18 via the insulating layer 16, and causes undesired electromagnetic conductive emission, or effective parasitic capacitance 20 to the ground structure 18. Also, an undesired thickness of the insulating layer 16 prevents the substrate 10 from effectively facilitating a transfer of heat from the electrical component 12 to the ground structure 18.

FIG. 2 schematically illustrates a second prior art substrate 40 that includes a plurality of insulating layers 42a-e separated by a plurality of conductive layers 44a-d. The first insulating layer 42a has a thickness of 381 microns (15 mils), which is also undesirably thick. However, this substrate 40 still demonstrates the undesired electromagnetic conductive emission problem discussed above.

SUMMARY

An example low conductive emission substrate includes a plurality of thin high dielectric strength insulating layers separated by a corresponding plurality of conductive layers, wherein one of the plurality of conductive layers is shorted to another one of the plurality of conductive layers.

An example method of manufacturing a low conductive emission substrate includes forming a first insulating layer, forming a first conductive layer on the first insulating layer, forming a second insulating layer on the first conductive layer, and forming a second conductive layer on the second insulating layer. The method also includes electrically coupling the first conductive layer to the second conductive layer.

These and other features of the present invention can be best understood from the following specification and drawings, the following of which is a brief description.

DETAILED DESCRIPTION OF THE PREFERRED EMBODIMENT

Figure 1:
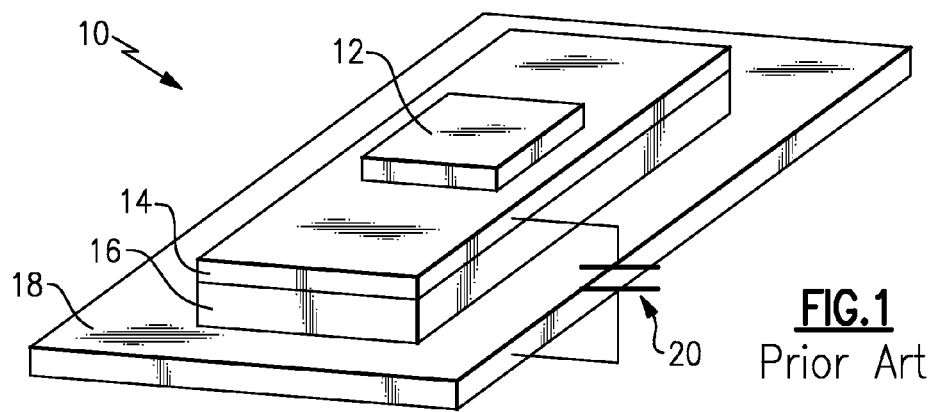
FIG. 1 schematically illustrates a first prior art multi-layer substrate for an electrical component.
Figure 2:
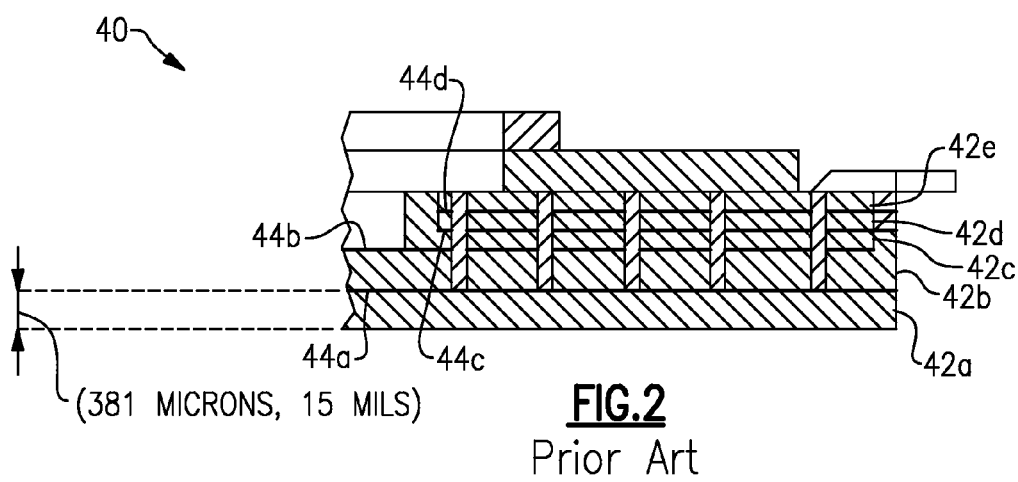
FIG. 2 schematically illustrates a second prior art multi-layer substrate for an electrical component.

As discussed above, FIG. 1 schematically illustrates a first, prior art multi-layer substrate 10 for an electrical component 12, that exhibits an effective parasitic capacitance 20 and poor heat transfer from the electrical component 12 to the ground structure 18. It is understood that the parasitic capacitance 20 effectively behaves as a capacitor but does not correspond to an actual capacitor. The substrate 40 illustrated in FIG. 2 also exhibits this undesired parasitic capacitance.

Figure 3:
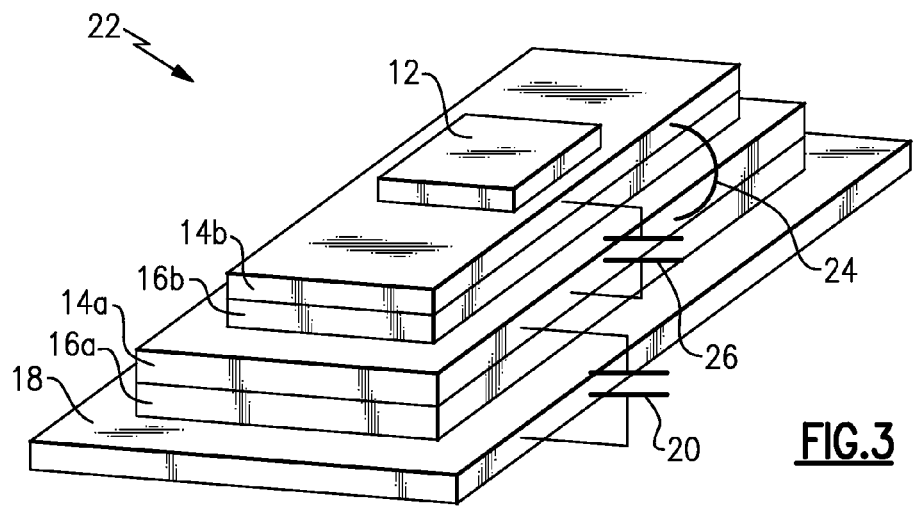
FIG. 3 schematically illustrates a second multi-layer substrate for an electrical component.

FIG. 3 schematically illustrates a second multi-layer substrate 22 that is operable to accommodate the effective parasitic capacitance 20 and is operable to conduct heat from the electrical component 12 to the ground structure 18. The substrate 22 includes a plurality of thin high dielectric strength insulating layers 16a, 16b separated by a corresponding plurality of conductive layers 14a, 14b. The term "high dielectric strength" refers to a dielectric strength greater than 500 volts per mil (19.68 volts per micron). In one example "high dielectric strength" refers to a dielectric strength of at least approximately 15,876 volts per mil (6.25 volts per micron). As shown in FIG. 3, the substrate 22 includes ground structure 18, a first insulating layer 16a formed on the ground structure 18, and a first conductive layer 14a formed on the first insulating layer 16a. The ground structure 18 could include any structure used for a ground connection, such as a ground plate.

As described above, an effective parasitic capacitance 20 occurs between the first conductive layer 14a and the ground structure 18 via the first insulating layer 16a. To address the effective parasitic capacitance 20, a second insulating layer 16b is formed on the first conductive layer 14a, and a second conductive layer 14b is formed on the second insulating layer 16b. The conductive layers 14a, 14b are electrically coupled via a connection 24 to form a second effective parasitic capacitance 26 between the second conductive layer 14b and the first conductive layer 14a via the second insulating layer 16b. The second parasitic capacitance 26 negates the effects of the effective parasitic capacitance 20, and provides a conductive emissions protection function by reducing electromagnetic emission to the ground structure 18. In one example the substrate 22 is operable to reduce conductive emissions to a level 1,000 times less than that exhibited by substrate 10. The substrate 22 may therefore be described as a low conductive emission substrate.

The electrical component 12 is received on the second conductive layer 14b. In one example, the electrical component 12 corresponds to a MOSFET, JFET, or BJT switch which may be formed on a die. The layers 14a, 16a provide a "Faraday shield" due to the insulating effect they provide between the electrical component 12 and the ground structure 18.

The insulating layers 16a, 16b may be formed using a pulsed laser deposition technique in which a laser is pulsed to form a thin layer of insulating material, or may be formed using an E-beam deposition process (in which an electron beam is used instead of a laser beam). In one example the insulating layers 16a, 16b have a thickness significantly less than 381 microns (15 mils). In one example the insulating layers 16a, 16b have a thickness of 1 micron (0.04 mils). In one example the insulating layers 16a, 16b have a thickness between 0.05-5.00 microns (0.0019-0.196 mils). Some example deposited materials for the insulating layers 16a, 16b include silicon carbide ("SiC"), silicon nitride ("$Si_3N_4$"), silicon dioxide ("$SiO_2$"), aluminum nitride ("AlN"), aluminum oxide or alumina ("$Al_2O_3$"), and hafnium dioxide or hafnia ("$HfO_2$"). One laser capable of forming the layers 16a, 16b is manufactured by BlueWave Semiconductors. Reducing a thickness of the layers 16a, 16b can improve the thermal conductivity of the substrate 22 to conduct heat from the electrical component 12 to the ground structure 18 efficiently.

The conductive layers 14a, 14b may also be formed using the pulsed laser deposition technique, the E-beam deposition technique, or a chemical vapor process. Some example deposited materials for the conductive layers 14a, 14b include copper, aluminum, nickel, and gold. The formation of thin conductive layers 14a, 14b can also help improve thermal conductivity between the electrical component 12 and the ground plate 18. The laser deposition technique mentioned above results in a layer of material deposited in column-like formations.

Equation 1, shown below, may be used to calculate a capacitance.

$$C = \frac{\varepsilon_r \cdot \varepsilon_0 \cdot A}{d} \qquad \text{Equation 1}$$

where
A is a surface area of a conductive layer;
d is a distance between conductive layer;
$\varepsilon_r$ is a dielectric constant of a given material; and
$\varepsilon_0$ is the standard dielectric constant of air.

As shown in Equation 1, decreasing the distance between conductive layers 14a, 14b can undesirably increase the effective parasitic capacitance 20 of the multi-layer substrate 22. However, by electrically coupling the conductive layers 14a, 14b via connection 24, the effective parasitic capacitance 20 can be diminished.

Although a preferred embodiment of this invention has been disclosed, a worker of ordinary skill in this art would recognize that certain modifications would come within the scope of the claims. For that reason, the following claims should be studied to determine their true scope and content.

What is claimed is:

1. A multi-layer substrate comprising:
a plurality of high dielectric strength insulating layers separated by a corresponding plurality of conductive layers, wherein each of the plurality of high dielectric strength insulating layers has a dielectric strength of at least approximately 6.25 volts per micron and one of the plurality of conductive layers is shorted to another one of the plurality of conductive layers.

2. The substrate of claim 1, wherein at least one of the plurality of insulating layers is formed using a laser deposition process.

3. The substrate of claim 1, wherein at least one of the plurality of insulating layers is formed using an E-beam deposition process.

4. The substrate of claim 2, wherein at least one of the plurality of insulating layers includes at least one material selected from the group consisting of silicon carbide, silicon nitride, silicon dioxide, aluminum nitride, aluminum oxide, alumina, hafnium dioxide, and hafnia.

5. The substrate of claim 2, wherein at least one of the plurality of conductive layers are formed using the laser deposition process.

6. The substrate of claim 5, wherein at least one of the plurality of conductive layers includes at least one material selected from the group consisting of copper, aluminum, nickel, and gold.

7. The substrate of claim 1, further comprising a die coupled to one of the plurality of conductive layers.

8. The substrate of claim 7, wherein the die corresponds to a switch.

9. The substrate of claim 6, wherein the plurality of conductive layers and the plurality of insulating layers are operable to transfer heat.

10. The substrate of claim 1, wherein one of the plurality of insulating layers and one of the plurality of conductive layers collectively provide a Faraday shield.

11. A multi-layer substrate comprising:
a first insulating layer having a thickness of 1 micron;
a first conductive layer formed on the first insulating layer;
a second insulating layer formed on the first conductive layer, wherein the second insulating layer has a thickness of 1 micron;
a second conductive layer formed on the second insulating layer, the second conductive layer being operable to receive an electrical component; and
an electrical connection between the first conductive layer and the second conductive layer.

12. The substrate of claim 11, wherein the first insulating layer and the second insulating layer are formed using at least one of a laser deposition process and an E-beam deposition process.

13. The substrate of claim 11, wherein a die is coupled to the second conductive layer, and wherein the first conductive layer, the first insulating layer, the second conductive layer, and the second insulating layer are operable to transfer heat.

14. The substrate of claim 1, wherein each of the plurality of high dielectric strength insulating layers has a dielectric strength that is greater than 19.68 volts per micron.

15. The substrate of claim 1, wherein at least one of the plurality of insulating layers includes silicon carbide.

16. A multi-layered substrate comprising:
a plurality of high dielectric strength insulating layers separated by a corresponding plurality of conductive layers, wherein at least one of the plurality of insulating layers includes hafnia and one of the plurality of conductive layers is shorted to another one of the plurality of conductive layers.

* * * * *